(12) United States Patent
Yoshikawa et al.

(10) Patent No.: US 11,921,311 B2
(45) Date of Patent: Mar. 5, 2024

(54) ILLUMINATION DEVICE

(71) Applicant: NITTO DENKO CORPORATION, Ibaraki (JP)

(72) Inventors: Takahiro Yoshikawa, Ibaraki (JP); Daisuke Hattori, Ibaraki (JP); Ryota Morishima, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 17/913,567

(22) PCT Filed: Mar. 26, 2021

(86) PCT No.: PCT/JP2021/012769
§ 371 (c)(1),
(2) Date: Sep. 22, 2022

(87) PCT Pub. No.: WO2021/193894
PCT Pub. Date: Sep. 30, 2021

(65) Prior Publication Data
US 2023/0145275 A1    May 11, 2023

(30) Foreign Application Priority Data

Mar. 27, 2020   (JP) ................................ 2020-057730

(51) Int. Cl.
*F21V 8/00*      (2006.01)
*G02F 1/13357*   (2006.01)

(52) U.S. Cl.
CPC ......... *G02B 6/0028* (2013.01); *G02B 6/0073* (2013.01); *G02F 1/133615* (2013.01)

(58) Field of Classification Search
CPC ................ G02B 6/0028; G02B 6/0073; G02F 1/133615
See application file for complete search history.

(56) References Cited

U.S. PATENT DOCUMENTS

| | | | |
|---|---|---|---|
| 7,901,125 B2 | 3/2011 | Iwasaki | |
| 2008/0049445 A1* | 2/2008 | Harbers | ............... G02B 6/0025 362/615 |
| 2009/0196069 A1 | 8/2009 | Iwasaki | |

(Continued)

FOREIGN PATENT DOCUMENTS

| JP | 2012-114284 A | 6/2012 |
|---|---|---|
| WO | 2007/083805 A1 | 7/2007 |
| WO | 2019/151073 A1 | 8/2019 |

OTHER PUBLICATIONS

International Search Report dated May 25, 2021, issued in counterpart Application No. PCT/JP2021/012769. (2 pages).

*Primary Examiner* — Leah Simone Macchiarolo
(74) *Attorney, Agent, or Firm* — WHDA, LLP

(57) ABSTRACT

Provided is a lighting apparatus having high light entrance efficiency with respect to a light guide plate, and being excellent in tint of light emitted from the light guide plate. The lighting apparatus of the present invention includes: an LED package; a light guide plate, which includes a main surface serving as a light emission surface, and a side surface serving as a light entrance surface, and which is arranged so that the side surface is opposed to the LED package; and a low-refractive index layer arranged between the LED package and the light guide plate.

11 Claims, 2 Drawing Sheets

(56) References Cited

U.S. PATENT DOCUMENTS

| | | |
|---|---|---|
| 2012/0132933 A1 | 5/2012 | Watari et al. |
| 2013/0208495 A1* | 8/2013 | Dau .................... G02B 6/0078 362/551 |
| 2016/0322543 A1 | 11/2016 | Jeon et al. |
| 2017/0045666 A1* | 2/2017 | Vasylyev ............. G02B 6/0018 |
| 2020/0355866 A1 | 11/2020 | Hattori et al. |

* cited by examiner

Fig.1
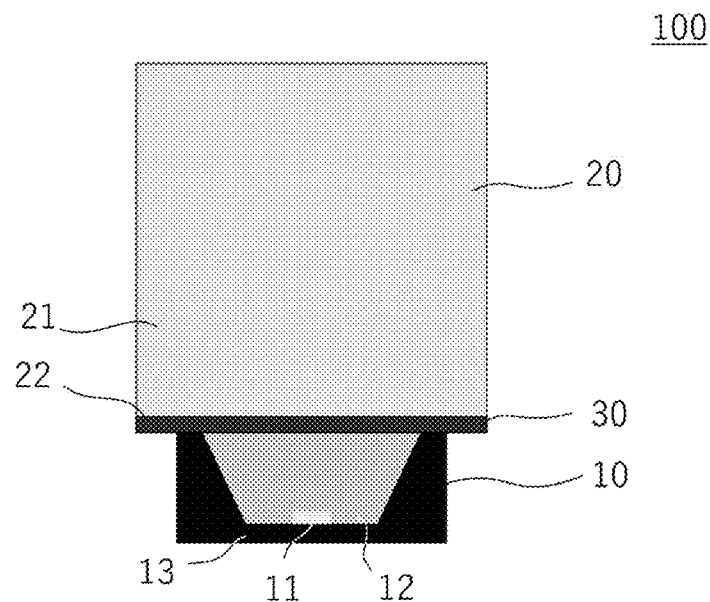
Fig.2
Fig. 2(a)
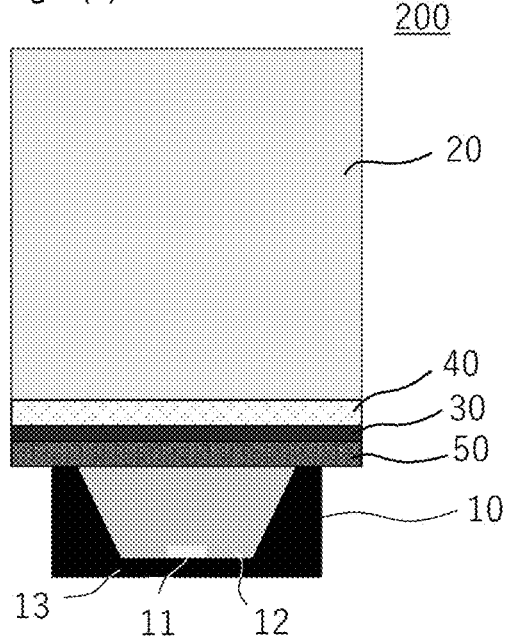
Fig. 2(b)
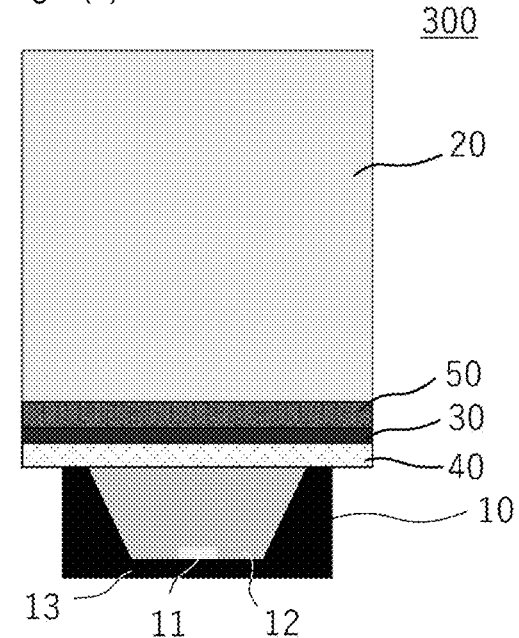

ILLUMINATION DEVICE

TECHNICAL FIELD

The present invention relates to a lighting apparatus. More specifically, the present invention relates to a lighting apparatus including an LED light source.

BACKGROUND ART

Liquid crystal displays for displaying images are widely adopted in portable terminals, personal computers, car navigation systems, televisions, and the like. In the liquid crystal display, frequent use is made of a planar backlight, which is arranged on a back surface side of a liquid crystal display panel, and emits planar light. Among the planar backlights, a sidelight-type planar backlight is often adopted, in which an LED light source is arranged on a side end surface (hereinafter sometimes referred to as entrance surface) of a light guide plate, and light that has entered through the entrance surface is emitted from a main surface (hereinafter sometimes referred to as emission surface) of the light guide plate.

In addition, as a lighting fixture excellent in design property, there is known an LED lighting fixture that uses an LED as a light source and performs planar lighting by radiating light via a light guide plate.

CITATION LIST

Patent Literature

[PTL 1] JP 2012-114284 A

SUMMARY OF INVENTION

Technical Problem

As one of the demands for the lighting apparatus including the light guide plate as described above, there is given an increase in light entrance efficiency with respect to the light guide plate (i.e., a saving in energy and/or an increase in brightness). In addition, in the lighting apparatus, there is also a demand for the optimization of the tint of emitted light (which is preferably white in the case of a white LED, for example).

An object of the present invention is to provide a lighting apparatus including a light guide plate, the lighting apparatus having high light entrance efficiency with respect to the light guide plate, and being excellent in tint of light emitted from the light guide plate.

Solution to Problem

According to one aspect of the present invention, there is provided a lighting apparatus, including: an LED package; a light guide plate, which includes a main surface serving as a light emission surface, and a side surface serving as a light entrance surface, and which is arranged so that the side surface is opposed to the LED package; and a low-refractive index layer arranged between the LED package and the light guide plate.

In one embodiment, the lighting apparatus is free of an air layer as another layer between the LED package and the low-refractive index layer.

In one embodiment, the lighting apparatus is free of an air layer as another layer between the light guide plate and the low-refractive index layer.

In one embodiment, the lighting apparatus is free of an air layer as another layer between the LED package and the light guide plate.

In one embodiment, the LED package includes: an LED chip; and an encapsulating resin configured to encapsulate the LED chip.

In one embodiment, the LED package further includes: a phosphor contained in the encapsulating resin; and an accommodating portion configured to accommodate the encapsulating resin, wherein a surface of the encapsulating resin opposed to the LED chip serves as an emission surface of the LED package, and wherein the low-refractive index layer is arranged on the emission surface side.

In one embodiment, the low-refractive index layer has a refractive index of 1.30 or less.

In one embodiment, the low-refractive index layer has voids.

In one embodiment, the lighting apparatus further includes: an adhesion layer; and a base material, wherein the adhesion layer, the low-refractive index layer, and the base material are arranged in the stated order between the LED package and the light guide plate.

In one embodiment, the adhesion layer is arranged between the low-refractive index layer and the light guide plate.

In one embodiment, the base material is arranged between the low-refractive index layer and the light guide plate.

In one embodiment, a total of a thickness of the base material and a thickness of the adhesion layer is 85% or more with respect to a total of a thickness of the low-refractive index layer, the thickness of the base material, and the thickness of the adhesion layer.

According to another aspect of the present invention, there is provided an image display apparatus. The image display apparatus includes: the lighting apparatus serving as a backlight; and an image display panel arranged on the main surface side of the light guide plate.

Advantageous Effects of Invention

According to the present invention, the lighting apparatus including the light guide plate, the lighting apparatus having high light entrance efficiency with respect to the light guide plate, and being excellent in tint of light emitted from the light guide plate, can be provided.

BRIEF DESCRIPTION OF DRAWINGS

FIG. 1 is a schematic view of a lighting apparatus according to one embodiment of the present invention as viewed from a light guide plate main surface side.

FIG. 2(a) and FIG. 2(b) are schematic views of lighting apparatus according to other embodiments of the present invention as viewed from the light guide plate main surface side.

DESCRIPTION OF EMBODIMENTS

A. Outline of Lighting Apparatus

Figure 3:
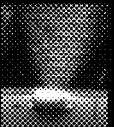
FIG. 3 includes photographs for describing tint evaluation in Examples and Comparative Example.

FIG. 1 is a schematic view of a lighting apparatus according to one embodiment of the present invention. The lighting apparatus according to this embodiment includes an LED package 10, a light guide plate 20, and a low-refractive index layer 30 arranged between the LED package 10 and the light guide plate 20. The light guide plate 20 includes a main surface 21 serving as a light emission surface, and a side surface 22 serving as a light entrance surface. In FIG. 1 (and FIGS. 2(a) and 2(b) to be described later), a lighting apparatus viewed from the main surface 21 side is illustrated, and in the lighting apparatus, light emitted from the LED package 10 to the upper side of the drawing sheet passes through the light guide plate to be emitted to the front side of the drawing sheet. The light guide plate 20 is arranged so that the side surface 22 serving as the light entrance surface is opposed to the LED package 10. More specifically, the light guide plate 20 and the LED package 10 are arranged so as to be opposed to each other via the low-refractive index layer 30. In one embodiment, the main surface 21 serving as the light emission surface is a surface that is approximately perpendicular to the side surface 22 serving as the light entrance surface. The light emission surface of the light guide plate may be a surface other than the light entrance surface. That is, the light emission surface may be both main surfaces of the light guide plate, or may be a side surface other than the side surface serving as the light entrance surface. In one embodiment, the LED package 10 includes an LED chip 11 and an encapsulating resin 12 for encapsulating the LED chip 11. In addition, the encapsulating resin 12 may contain a phosphor (e.g., a red phosphor or a green phosphor). In FIG. 1 (and FIGS. 2(a) and 2(b) to be described later), for ease of viewing, only one LED package 10 is illustrated. However, in the lighting apparatus of the present invention, a plurality of LED packages may form an LED light source. In other words, the lighting apparatus of the present invention may include an LED light source formed by one or more arrays of a plurality of LED packages. The LED light source may be arranged so as to be opposed to the side surface of the light guide plate (the side surface serving as the light entrance surface).

FIG. 2(a) and FIG. 2(b) are schematic views of lighting apparatus according to other embodiments of the present invention. The lighting apparatus of the present invention may further include another layer besides the low-refractive index layer 30 between the LED package 10 and the light guide plate 20. Examples of the other layer include an adhesion layer and a base material. In one embodiment, as illustrated in each of FIG. 2(a) and FIG. 2(b), the lighting apparatus further includes an adhesion layer 40 and a base material 50, and the adhesion layer 40, the low-refractive index layer 30, and the base material 50 are arranged in the stated order between the LED package 10 and the light guide plate 20. In a lighting apparatus 200 illustrated in FIG. 2(a), the adhesion layer 40 is arranged between the low-refractive index layer 30 and the light guide plate 20 (i.e., the base material 50 is arranged between the low-refractive index layer 30 and the LED package 10). In a lighting apparatus 300 illustrated in FIG. 2(b), the base material 50 is arranged between the low-refractive index layer 30 and the light guide plate 20 (i.e., the adhesion layer 40 is arranged between the low-refractive index layer 30 and the LED package 10). The "adhesion layer" is a concept including a layer containing an adhesive and a layer containing a pressure-sensitive adhesive.

It is preferred that the lighting apparatus of the present invention be free of an air layer as the other layer between the LED package 10 and the low-refractive index layer 30. In addition, it is preferred that the lighting apparatus of the present invention be free of an air layer as the other layer between the light guide plate 20 and the low-refractive index layer 30. It is more preferred that the lighting apparatus of the present invention be free of an air layer as the other layer between the LED package 10 and the light guide plate 20. In one embodiment, as illustrated in FIG. 1, the low-refractive index layer, and the LED package 10 and the light guide plate 20 may be arranged without a void (i.e., without via an air layer). In addition, in each of the lighting apparatus illustrated in FIG. 2(a) and FIG. 2(b), a configuration including the adhesion layer 40, the low-refractive index layer 30, and the base material 50 may be arranged without forming a void between the LED package 10 and the light guide plate 20 (i.e., without via an air layer). In addition, the configuration including the adhesion layer 40, the low-refractive index layer 30, and the base material 50 is preferably free of an air layer as the other layer. In one embodiment, the configuration including the adhesion layer 40, the low-refractive index layer 30, and the base material 50 may be an integral configuration, and may be, for example, a low-refractive index film.

In the present invention, the arrangement of the low-refractive index layer can provide a difference between the refractive index of a constituent material for the LED package (typically the encapsulating resin for encapsulating the LED chip) and the refractive index of the low-refractive index layer, and hence light is reflected at an interface between the LED package and the low-refractive index layer in a preferred manner to cause multiple reflection in the LED package in a preferred manner, to thereby increase light to be absorbed by the phosphor. As a result, light excellent in tint (typically white light) can be emitted.

In a related-art lighting apparatus, a void (air layer) is arranged between an LED package (LED light source) and a light guide plate to cause multiple reflection in the LED package. However, in the lighting apparatus having such related-art configuration, the presence of the void widens a distance between the LED package (LED light source) and the light guide plate, which causes a reduction in light entrance efficiency with respect to the light guide plate. When an attempt is made to narrow the distance between the LED package (LED light source) and the light guide plate, there occurs an LED package that is brought into close contact with the light guide plate owing to, for example, a variation in size among LED packages or a variation in arrangement among LED packages. When the LED package is brought into close contact with the light guide plate, reflection at an interface between these members hardly occurs, and hence the number of times of multiple reflection is reduced. As a result, the tint of emitted light becomes poor, and for example, while white emitted light is desired, bluish emitted light is obtained. The lighting apparatus of the present invention allows the LED package (LED light source) and the light guide plate to be close to each other, and is excellent in light entrance efficiency. The lighting apparatus of the present invention is advantageous in that, while the LED package (LED light source) and the light guide plate are made close to each other, light excellent in tint can be emitted as described above.

In the related-art lighting apparatus, a void needs to be arranged between the LED package (LED light source) and the light guide plate, and hence the light guide plate needs to be fixed with a supporting member. Meanwhile, in the present invention, the void can be eliminated to integrate the LED package (LED light source) and the light guide plate with each other, and hence the lighting apparatus can have a configuration that does not use the supporting member for fixing the light guide plate.

The lighting apparatus may further include any appropriate other member. For example, the lighting apparatus may further include a reflective plate arranged to be opposed to the main surface (light emission surface) of the light guide plate.

When the lighting apparatus of the present invention includes the base material and the adhesion layer, the total of the thickness of the base material and the thickness of the adhesion layer is preferably 85% or more, more preferably 90% or more, still more preferably from 90% to 99.9% with respect to the total of the thickness of the low-refractive index layer, the thickness of the base material, and the thickness of the adhesion layer. When the total of the thickness of the base material and the thickness of the adhesion layer falls within such ranges, a lighting apparatus being excellent in light entrance efficiency and having high brightness can be provided.

B. Low-Refractive Index Layer

The refractive index of the low-refractive index layer is preferably 1.30 or less. The arrangement of the low-refractive index layer having such refractive index can provide a difference between the refractive index of a constituent material for the LED package (typically the encapsulating resin for encapsulating the LED chip) and the refractive index of the low-refractive index layer. Consequently, light can be satisfactorily reflected at the LED package side interface of the low-refractive index layer, and as a result, multiple reflection in the LED package can be caused in a preferred manner. The refractive index of the low-refractive index layer is preferably 1.23 or less, more preferably 1.20 or less, still more preferably 1.18 or less, particularly preferably 1.15 or less. The refractive index of the low-refractive index layer is preferably as low as possible, but the lower limit thereof is, for example, 1.07 or more (preferably 1.05 or more). As used herein, the term "refractive index" refers to a refractive index measured at a wavelength of 550 nm.

The thickness of the low-refractive index layer is preferably from 0.01 µm to 1,000 µm, more preferably from 0.05 µm to 100 µm, still more preferably from 0.1 µm to 80 µm, particularly preferably from 0.3 µm to 50 µm.

The low-refractive index layer may have any appropriate form as long as its refractive index falls within the above-mentioned ranges. In one embodiment, the low-refractive index layer has voids. The "air layer as the other layer" described in the section A and the low-refractive index layer having voids are different layers.

The void ratio of the low-refractive index layer having voids is preferably 35 vol % or more, more preferably 38 vol % or more, particularly preferably 40 vol % or more. When the void ratio falls within such ranges, a low-refractive index layer having a particularly low refractive index can be formed. The upper limit of the void ratio of the low-refractive index layer is, for example, 90 vol % or less, preferably 75 vol % or less. When the upper limit falls within such ranges, a low-refractive index layer excellent in strength can be formed. When the layer to be subjected to the measurement of the void ratio is merely a single layer containing voids, a ratio (volume ratio) between a constituent material for the layer and air may be calculated by a conventional method (involving, for example, measuring the weight and volume of the layer and calculating the density thereof), and hence the void ratio (vol %) may be thus calculated. In addition, the refractive index and the void ratio correlate with each other, and hence, for example, the void ratio may also be calculated from the value of the refractive index as a layer. Specifically, for example, the void ratio is calculated by Lorentz-Lorenz's formula from the value of the refractive index measured with an ellipsometer.

The size of each of the voids is preferably from 2 nm to 500 nm, more preferably from 5 nm to 500 nm, still more preferably from 10 nm to 200 nm, particularly preferably from 20 nm to 100 nm. The size of each of the voids may be measured by a BET test method. Specifically, the void size may be evaluated from a pore distribution obtained by: loading 0.1 g of a low-refractive index layer sample into a capillary of a specific surface area measurement apparatus (product name: "ASAP2020", manufactured by Micromeritics Instrument Corporation); then removing gas in its void structure through drying under reduced pressure at room temperature for 24 hours; and then adsorbing a nitrogen gas onto the low-refractive index layer sample.

The peak pore diameter of the low-refractive index layer having voids is preferably from 5 nm to 50 nm, more preferably from 10 nm to 40 nm, still more preferably from 20 nm to 30 nm. The peak pore diameter is determined from a BJH plot and a BET plot, and an isothermal adsorption curve, each of which is based on nitrogen adsorption, through use of a pore distribution/specific surface area measurement apparatus (product name: "BELLSORP MINI", manufactured by MicrotracBEL Corp.).

The low-refractive index layer having voids contains, for example, approximately spherical particles, such as silicone particles, silicone particles having fine pores, or silica hollow nanoparticles, fibrous particles, such as a cellulose nanofiber, an alumina nanofiber, or a silica nanofiber, or flat plate-like particles such as nanoclay formed of bentonite. In one embodiment, the low-refractive index layer having voids is a porous body formed by chemical bonding between particles. In addition, at least some of the particles forming the low-refractive index layer having voids may be bonded to each other via a small amount of a binder component (e.g., a binder component having a weight equal to or smaller than that of the particles). The void ratio and refractive index of the low-refractive index layer having voids may be adjusted on the basis of, for example, the particle diameters and particle diameter distribution of the particles forming the low-refractive index layer.

As a method of obtaining the low-refractive index layer having voids, there are given, for example, methods described in JP 2010-189212 A, JP 2008-040171 A, JP 2006-011175 A, WO 2004/113966 A1, and references thereof. Specific examples thereof include: a method involving hydrolyzing and polycondensing at least one of a silica-based compound, or a hydrolyzable silane, or a partial hydrolysate or dehydration condensate thereof; a method involving using porous particles and/or hollow fine particles; a method involving utilizing a spring-back phenomenon to produce an aerogel layer; and a method involving using a pulverized gel, which is obtained by pulverizing a gel obtained by a sol-gel method and chemically bonding fine porous particles in the pulverized liquid to each other with a catalyst or the like. However, the low-refractive index layer may be produced by any production method, which is not limited to the above-mentioned production methods.

The low-refractive index layer having voids is preferably a silicone porous body. The silicone porous body may be formed of fine porous particles of a silicon compound that are bonded to each other. An example of the fine porous particles of a silicon compound is a pulverized product of a gelled silicon compound. In one embodiment, the silicone porous body may be formed by, for example, applying an application liquid containing the pulverized product of a gelled silicon compound to the side surface of a light guide plate. In another embodiment, the silicone porous body is formed through application to a base material, and a low-refractive index film including the base material and the silicone porous body (and an adhesion layer to be arranged as required) may be introduced into the lighting apparatus. The pulverized product of a gelled silicon compound may be subjected to, for example, the action of a catalyst, light irradiation, or heating, to form a chemical bond (e.g., a siloxane bond).

An example of the silicon compound is a compound represented by the following formula (1).

(1)

In the formula (1), X represents 2, 3, or 4. $R^1$ represents preferably a linear or branched alkyl group having 1 to 6 carbon atoms, more preferably a linear or branched alkyl group having 1 to 4 carbon atoms, still more preferably an alkyl group having 1 or 2 carbon atoms. $R^2$ represents preferably a hydrogen atom or a linear or branched alkyl group having 1 to 6 carbon atoms, more preferably a hydrogen atom or a linear or branched alkyl group having 1 to 4 carbon atoms, still more preferably a hydrogen atom or an alkyl group having 1 or 2 carbon atoms.

Specific examples of the silicon compound include tris (hydroxy)methylsilane and trimethoxy(methyl)silane.

In one embodiment, the silicon compound is a trifunctional silane. When the trifunctional silane is used, a low-refractive index layer having a particularly low refractive index can be formed. In another embodiment, the silicon compound is a tetrafunctional silane.

The gelation of the silicon compound may be performed by, for example, a dehydration condensation reaction of the silicon compound. Any appropriate method may be adopted as a method for the dehydration condensation reaction.

Any appropriate method may be adopted as a pulverization method for the gelled silicon compound. An example of the pulverization method is a method involving using a pulverization apparatus making use of a cavitation phenomenon, such as an ultrasonic homogenizer or a high-speed rotating homogenizer.

The volume-average particle diameter of the fine porous particles of a silicon compound (pulverized product of a gelled silicon compound) is preferably from 0.1 μm to 2 μm, more preferably from 0.2 μm to 1.5 μm, still more preferably from 0.4 μm to 1 μm. The volume-average particle diameter may be measured by a dynamic light scattering method.

With regard to the particle size distribution of the fine porous particles of a silicon compound (pulverized product of a gelled silicon compound), the ratio of particles each having a particle diameter of from 0.4 μm to 1 μm to all particles is preferably from 50 wt % to 99.9 wt %, more preferably from 80 wt % to 99.8 wt %, still more preferably from 90 wt % to 99.7 wt %. In addition, the ratio of particles each having a particle diameter of from 1 μm to 2 μm to all particles is preferably from 0.1 wt % to 50 wt %, more preferably from 0.2 wt % to 20 wt %, still more preferably from 0.3 wt % to 10 wt %. The particle size distribution may be measured with a particle size distribution evaluation apparatus.

The application liquid for forming the low-refractive index layer contains any appropriate solvent. Examples of the solvent include isopropyl alcohol, ethanol, methanol, n-butanol, 2-butanol, isobutyl alcohol, and pentanol.

In one embodiment, the application liquid for forming the low-refractive index layer further contains a catalyst. A catalyst capable of promoting the chemical bonding of the particles is used as the catalyst. For example, when the fine porous particles of a silicon compound are used as the particles, a catalyst capable of promoting a dehydration condensation reaction of silanol groups of the silicon compound is used. Examples of the catalyst include: base catalysts, such as potassium hydroxide, sodium hydroxide, and ammonium hydroxide; and acid catalysts, such as hydrochloric acid, acetic acid, and oxalic acid. Of those, a base catalyst is preferred. The content ratio of the catalyst is preferably from 0.01 part by weight to 20 parts by weight, more preferably from 0.1 part by weight to 5 parts by weight with respect to 100 parts by weight of the particles in the application liquid.

Any appropriate method may be adopted as an application method for the application liquid. Examples of the application method include bar coater coating, air knife coating, gravure coating, gravure reverse coating, reverse roll coating, lip coating, die coating, and dip coating.

Any appropriate method may be adopted as a drying method for the application liquid. The drying method for the application liquid may be natural drying, drying by heating, or drying under reduced pressure. As heating means, there are given, for example, a hot air fan, a heating roll, and a far-infrared heater.

C. Base Material

The base material may be formed of any appropriate material. Examples of the material for forming the base material include: thermoplastic resins, such as a polyethylene terephthalate-based resin, an acrylic resin, a cellulose-based resin, a cycloolefin-based resin, and an olefin-based resin; thermosetting resins; inorganic materials, such as glass and silicon; and carbon fiber materials.

The thickness of the base material is not particularly limited, and may be set to any appropriate thickness depending on applications. The thickness of the base material is, for example, from 1 μm to 1,000 μm.

The refractive index of the base material is preferably from 1.30 to 1.75, more preferably from 1.40 to 1.65.

D. Adhesion Layer

The adhesion layer contains any appropriate pressure-sensitive adhesive or adhesive. The pressure-sensitive adhesive and the adhesive each preferably have transparency and optical isotropy. Specific examples of the pressure-sensitive adhesive include a rubber-based pressure-sensitive adhesive, an acrylic pressure-sensitive adhesive, a silicone-based pressure-sensitive adhesive, an epoxy-based pressure-sensitive adhesive, and a cellulose-based pressure-sensitive adhesive. Of those, a rubber-based pressure-sensitive adhesive or an acrylic pressure-sensitive adhesive is preferred. Specific examples of the adhesive include a rubber-based adhesive, an acrylic adhesive, a silicone-based adhesive, an epoxy-based adhesive, and a cellulose-based adhesive. In addition, a pressure-sensitive adhesive or an adhesive formed of, for example, a water-soluble cross-linking agent for a vinyl alcohol-based polymer, such as glutaraldehyde, melamine, or oxalic acid, may be used.

The thickness of the adhesion layer is preferably from 0.1 μm to 100 μm, more preferably from 5 μm to 50 μm, still more preferably from 10 μm to 30 μm.

The refractive index of the adhesion layer is preferably from 1.42 to 1.60, more preferably from 1.47 to 1.58.

E. LED Package

The LED package is not particularly limited, and may have any appropriate form. The LED package is preferably an LED package containing an encapsulating resin. A phosphor may be added into the encapsulating resin. In addition, the encapsulating resin and the low-refractive index layer or the low-refractive index film may be directly arranged (i.e., may be arranged without via another layer). In one embodiment, the LED package is an LED package of a surface mounting type. In another embodiment, the LED package is an LED package of a chip-on-board type.

In each of FIG. 1 and FIGS. 2(a) and 2(b), an LED package 10 of a surface mounting type is schematically illustrated. The LED package 10 in this embodiment includes the LED chip 11, the encapsulating resin 12 for encapsulating the LED chip, and an accommodating portion 13 for accommodating the encapsulating resin 12. In addition, the encapsulating resin 12 may contain a phosphor (not shown) (typically a red phosphor or a green phosphor). The surface of the encapsulating resin 12 opposed to the LED chip 11 serves as the emission surface of the LED package 10. The low-refractive index layer or the low-refractive index film may be directly arranged on the emission surface of the LED package.

Any appropriate light-transmitting resin may be used as the encapsulating resin. Examples of the resin include an acrylic resin, a silicone-based resin, and an olefin-based resin.

The refractive index of the encapsulating resin is preferably 1.40 or more, more preferably more than 1.45, still more preferably more than 1.45 and 2.00 or less, particularly preferably from 1.48 to 1.80.

The difference between the refractive index of the encapsulating resin and the refractive index of the low-refractive index layer is preferably 0.15 or more, more preferably 0.20 or more. When the difference falls within such ranges, light can be reflected at the interface between the LED package and the low-refractive index layer in a preferred manner to cause multiple reflection in the LED package in a preferred manner.

Any appropriate phosphor may be used as the phosphor. Examples of the phosphor include a sulfide-based phosphor, an oxide-based phosphor, a nitride-based phosphor, and a fluoride-based phosphor.

F. Light Guide Plate

Any appropriate material may be used as a material for forming the light guide plate as long as light radiated from the LED package (LED light source) can be efficiently guided. Examples of the material for forming the light guide plate include an acrylic resin, a polycarbonate-based resin, and a cycloolefin-based resin. The thickness of the light guide plate is, for example, from 100 μm to 1,000 μm.

The refractive index of the light guide plate is preferably 1.40 or more, more preferably more than 1.45, still more preferably more than 1.45 and 2.0 or less, particularly preferably from 1.48 to 1.80.

The difference between the refractive index of the light guide plate and the refractive index of the low-refractive index layer is preferably 0.15 or more, more preferably 0.20 or more. When the difference falls within such ranges, a lighting apparatus excellent in light utilization efficiency can be obtained. The refractive index of the light guide plate is generally higher than the refractive index of the low-refractive index layer.

G. Applications

The lighting apparatus of the present invention may be used as, for example, a backlight for an image display apparatus, or an LED lighting fixture.

In one embodiment, the image display apparatus includes: the lighting apparatus serving as a backlight; and an image display panel (preferably a liquid crystal display panel) arranged on the main surface (light emission surface) side of the light guide plate of the lighting apparatus.

The liquid crystal display panel includes a liquid crystal cell and a pair of polarizing plates arranged on both sides (viewer side and back surface side) of the liquid crystal cell. The pair of polarizing plates is typically arranged so that their absorption axes are substantially perpendicular or parallel to each other.

EXAMPLES

Now, the present invention is specifically described by way of Examples. However, the present invention is by no means limited to these Examples. Evaluation methods in Examples and Comparative Example are as described below. In addition, the terms "part(s)" and "%" are by weight unless otherwise stated.

<Evaluation Methods>
(1) Refractive Index

A low-refractive index layer was cut into a size of 50 mm×50 mm, and the resultant was bonded to the front surface of a glass plate (thickness: 3 mm) via a pressure-sensitive adhesion layer. A central portion (diameter: about 20 mm) of the back surface of the glass plate was painted over with a black felt-tip pen to provide a sample prevented from reflection at the back surface of the glass plate. The sample was set in an ellipsometer (manufactured by J.A. Woollam Japan: VASE), and its refractive index was measured under the conditions of a wavelength of 550 nm and an incident angle of from 50° to 80°.

(2) Tint of Light Emitted from Lighting Apparatus

With use of the tint of light emitted from a lighting apparatus in Reference Example 1 as a reference, a lighting apparatus emitting light having a tint comparable to that of the reference light was evaluated as "good", and a lighting apparatus emitting light having a tint different from that of the reference light was evaluated as "unacceptable".

In addition, photographs taken of light emitted from lighting apparatus are shown in FIG. 3.

[Production Example 1] Preparation of Application Liquid a for Forming Low-Refractive Index Layer (1) Gelation of Silicon Compound 0.95 g of MTMS serving as a precursor of a silicon compound was dissolved in 2.2 g of DMSO to prepare a mixed liquid A. To the mixed liquid A, 0.5 g of a 0.01 mol/L oxalic acid aqueous solution was added, and the mixture was stirred at room temperature for 30 minutes to hydrolyze MTMS. Thus, a mixed liquid B containing tris(hydroxy)methylsilane was produced.

0.38 g of 28 wt % ammonia water and 0.2 g of pure water were added to 5.5 g of DMSO, and then the mixed liquid B was further added. The mixture was stirred at room temperature for 15 minutes to perform gelation of tris(hydroxy)methylsilane. Thus, a mixed liquid C containing a gelled silicon compound was obtained.

(2) Maturation Treatment

The mixed liquid C containing the gelled silicon compound prepared as described above was subjected as it was to maturation treatment by being incubated at 40° C. for 20 hours.

(3) Pulverization Treatment

Next, the gelled silicon compound subjected to maturation treatment as described above was crushed using a spatula into granules each having a size of from several millimeters to several centimeters. Then, 40 g of IBA was added to the mixed liquid C, and the whole was lightly stirred and then left to stand still at room temperature for 6 hours to decant the solvent and the catalyst in the gel. Similar decantation treatment was performed three times to perform solvent replacement, to thereby provide a mixed liquid D. Then, the gelled silicon compound in the mixed liquid D was subjected to pulverization treatment (high-pressure media-less pulverization). The pulverization treatment (high-pressure media-less pulverization) was performed by weighing 1.85 g of the gelled compound in the mixed liquid D and 1.15 g of IBA into a 5 cc screw-capped vial and then pulverizing the contents under the conditions of 50 W and 20 kHz for 2 minutes through use of a homogenizer (manufactured by SMT Co., Ltd., product name: "UH-50").

As a result of the pulverization treatment, the gelled silicon compound in the mixed liquid D was pulverized, and thus the mixed liquid D became a sol liquid of a pulverized product. A volume-average particle diameter indicating a variation in particle size of the pulverized product contained in the mixed liquid D was found to be from 0.50 to 0.70 with a dynamic light scattering Nanotrac particle size analyzer (manufactured by Nikkiso Co., Ltd., model UPA-EX150). Further, to 0.75 g of the sol liquid (mixed liquid C'), a solution of a photobase generator (Wako Pure Chemical Industries, Ltd.: product name: WPBG-266) in methyl ethyl ketone (MEK) at a concentration of 1.5 wt % and a solution of bis(trimethoxysilyl)ethane in MEK at a concentration of 5% were added at a ratio of 0.062 g:0.036 g to provide an application liquid A for a low-refractive index layer.

[Production Example 2] Preparation of Application Liquid B for Forming Low-Refractive Index Layer To 0.75 g of the sol liquid (mixed liquid C') obtained in Production Example 1(3), a solution of a photobase generator (Wako Pure Chemical Industries, Ltd.: product name: WPBG-266) in methyl ethyl ketone (MEK) at a concentration of 1.5 wt % and a solution of bis(trimethoxysilyl)ethane in MEK at a concentration of 5% were added at a ratio of 0.062 g:0.148 g to provide an application liquid B for a low-refractive index layer.

[Production Example 3] Preparation of Application Liquid C for Forming Low-Refractive Index Layer To 0.75 g of the sol liquid (mixed liquid C') obtained in Production Example 1(3), a solution of a photobase generator (Wako Pure Chemical Industries, Ltd.: product name: WPBG-266) in methyl ethyl ketone (MEK) at a concentration of 1.5 wt % and a solution of bis(trimethoxysilyl)ethane in MEK at a concentration of 5% were added at a ratio of 0.062 g:0.185 g to provide an application liquid C for a low-refractive index layer.

[Production Example 4] Production of Adhesion (Pressure-Sensitive Adhesive) Layer A four-necked flask with a stirring blade, a temperature gauge, a nitrogen gas inlet tube, and a condenser was loaded with 90.7 parts of butyl acrylate, 6 parts of N-acryloylmorpholine, 3 parts of acrylic acid, 0.3 part of 2-hydroxybutyl acrylate, and 0.1 part by weight of 2,2'-azobisisobutyronitrile serving as a polymerization initiator together with 100 g of ethyl acetate. While the contents were gently stirred, a nitrogen gas was introduced to perform nitrogen purge. After that, with the liquid temperature in the flask being kept around 55° C., a polymerization reaction was performed for 8 hours to prepare an acrylic polymer solution. With respect to 100 parts of the solid content of the resultant acrylic polymer solution, 0.2 part of an isocyanate cross-linking agent (CORONATE L manufactured by Nippon Polyurethane Industry Co., Ltd., tolylene diisocyanate adduct of trimethylolpropane), 0.3 part of benzoyl peroxide (NYPER BMT manufactured by Nippon Oil & Fats Co., Ltd.), and 0.2 part of γ-glycidoxypropylmethoxysilane (manufactured by Shin-Etsu Chemical Co., Ltd.: KBM-403) were blended to prepare an acrylic pressure-sensitive adhesive solution. Then, the acrylic pressure-sensitive adhesive solution was applied to one surface of a silicone-treated polyethylene terephthalate (PET) film (manufactured by Mitsubishi Polyester Film Corporation, thickness: 38 μm) so that a pressure-sensitive adhesive layer after drying had a thickness of 10 μm, and the applied solution was dried at 150° C. for 3 minutes to form the pressure-sensitive adhesive layer.

Reference Example 1

A commercially available lighting apparatus of an edge light system including an LED light source formed of an LED package of a surface mounting type (encapsulating resin: acrylic resin, refractive index of encapsulating resin: 1.49) and a light guide plate (made of an acrylic resin, refractive index: 1.49) (distance between LED light source and light guide plate: 200 μm) was prepared, and it was recognized that light emitted from the light guide plate of the lighting apparatus was white.

Example 1

The application liquid A for a low-refractive index layer prepared in Production Example 1 was applied to an acrylic resin film (thickness: 20 μm) serving as a base material, and was dried to provide a laminate in which a low-refractive index layer (refractive index: 1.18) having a thickness of 850 nm was arranged on one surface of the base material. The low-refractive index layer was subjected to UV (300 mJ) irradiation, and then the pressure-sensitive adhesive layer of Production Example 4 was transferred onto the low-refractive index layer, followed by aging at 60° C. for 20 hours, to provide a low-refractive index film (base material (20 μm)/low-refractive index layer (1.5 μm)/pressure-sensitive adhesive layer (10 μm)).

The resultant low-refractive index film was arranged between the LED light source and the light guide plate of the lighting apparatus prepared in Reference Example 1 so that the pressure-sensitive adhesive layer was on the light guide plate side. The low-refractive index film was arranged so as to be brought into close contact with the LED light source and the light guide plate.

The thus obtained lighting apparatus was subjected to the evaluation (2). The result is shown in Table 1.

Example 2

The application liquid B for a low-refractive index layer prepared in Production Example 2 was applied to an acrylic resin film (thickness: 20 µm) serving as a base material, and was dried to provide a laminate in which a low-refractive index layer (refractive index: 1.23) having a thickness of 850 nm was arranged on one surface of the base material. The low-refractive index layer was subjected to UV (300 mJ) irradiation, and then the pressure-sensitive adhesive layer of Production Example 4 was transferred onto the low-refractive index layer, followed by aging at 60° C. for 20 hours, to provide a low-refractive index film (base material (20 µm)/low-refractive index layer (2.0 µm)/pressure-sensitive adhesive layer (5.0 µm)).

The resultant low-refractive index film was arranged between the LED light source and the light guide plate of the lighting apparatus prepared in Reference Example 1 so that the pressure-sensitive adhesive layer was on the LED light source side. The low-refractive index film was arranged so as to be brought into close contact with the LED light source and the light guide plate.

The thus obtained lighting apparatus was subjected to the evaluation (2). The result is shown in Table 1.

Example 3

The application liquid C for a low-refractive index layer prepared in Production Example 3 was applied to an acrylic resin film (thickness: 20 µm) serving as a base material, and was dried to provide a laminate in which a low-refractive index layer (refractive index: 1.25) having a thickness of 850 nm was arranged on one surface of the base material. The low-refractive index layer was subjected to UV (300 mJ) irradiation, and then the pressure-sensitive adhesive layer of Production Example 4 was transferred onto the low-refractive index layer, followed by aging at 60° C. for 20 hours, to provide a low-refractive index film (base material (20 µm)/low-refractive index layer (2.0 µm)/pressure-sensitive adhesive layer (5.0 µm)).

The resultant low-refractive index film was arranged between the LED light source and the light guide plate of the lighting apparatus prepared in Reference Example 1 so that the pressure-sensitive adhesive layer was on the light guide plate side. The low-refractive index film was arranged so as to be brought into close contact with the LED light source and the light guide plate.

The thus obtained lighting apparatus was subjected to the evaluation (2). The result is shown in Table 1.

Comparative Example 1

On the basis of the lighting apparatus prepared in Reference Example 1, the arrangement of the LED light source and the light guide plate was finely adjusted so that these members were brought into contact with each other.

The thus obtained lighting apparatus was subjected to the evaluation (2). The result is shown in Table 1.

TABLE 1

|  | Thickness ratio (pressure-sensitive adhesive layer thickness + base material thickness)/low-refractive index film thickness | Refractive index of low-refractive index layer | Arrangement of low-refractive index film | Tint evaluation |
| --- | --- | --- | --- | --- |
| Example 1 | 95 | 1.18 | Pressure-sensitive adhesive layer on light guide plate side | Good |
| Example 2 | 92 | 1.23 | Pressure-sensitive adhesive layer on LED light source side | Good |
| Example 3 | 85 | 1.25 | Pressure-sensitive adhesive layer on light guide plate side | Good |
| Comparative Example 1 | — | — | — | Unacceptable |

As apparent from Table 1 and FIG. 3, the lighting apparatus of the present invention is excellent in tint of light emitted from the light guide plate. In addition, the lighting apparatus of each of Examples 1 to 3 allows the distance between the LED light source and the light guide plate to be narrowed, and is excellent in entrance efficiency with respect to the light guide plate.

REFERENCE SIGNS LIST

10 LED package
11 LED chip
12 encapsulating resin
13 accommodating portion
20 light guide plate
21 main surface
22 side surface
30 low-refractive index layer
40 adhesion layer
50 base material
100 lighting apparatus
200 lighting apparatus
300 lighting apparatus

The invention claimed is:

1. A lighting apparatus, comprising:
an LED package;
a light guide plate, which includes a main surface serving as a light emission surface, and a side surface serving as a light entrance surface, and which is arranged so that the side surface is opposed to the LED package; and
a low-refractive index layer arranged between the LED package and the light guide plate;
where the lighting apparatus further includes an adhesion layer and a base materials;
the adhesion layer, the low-refractive index layer, and the base material are arranged in the stated order between the LED package and the light guide plate; and
a total of a thickness of the base material and a thickness of the adhesion layer is 85% or more with respect to a total of a thickness of the low-refractive index layer, the thickness of the base material, and the thickness of the adhesion layer.

2. The lighting apparatus according to claim 1, wherein the lighting apparatus is free of an air layer as another layer between the LED package and the low-refractive index layer.

3. The lighting apparatus according to claim 1, wherein the lighting apparatus is free of an air layer as another layer between the light guide plate and the low-refractive index layer.

4. The lighting apparatus according to claim 1, wherein the lighting apparatus is free of an air layer as another layer between the LED package and the light guide plate.

5. The lighting apparatus according to claim 1, wherein the LED package includes:
an LED chip; and
an encapsulating resin configured to encapsulate the LED chip.

6. The lighting apparatus according to claim 5,
wherein the LED package further includes:
a phosphor contained in the encapsulating resin; and
an accommodating portion configured to accommodate the encapsulating resin,
wherein a surface of the encapsulating resin opposed to the LED chip serves as an emission surface of the LED package, and
wherein the low-refractive index layer is arranged on the emission surface side.

7. The lighting apparatus according to claim 1, wherein the low-refractive index layer has a refractive index of 1.30 or less.

8. The lighting apparatus according to claim 1, wherein the low-refractive index layer has voids.

9. The lighting apparatus according to claim 1, wherein the adhesion layer is arranged between the low-refractive index layer and the light guide plate.

10. The lighting apparatus according to claim 1, wherein the base material is arranged between the low-refractive index layer and the light guide plate.

11. An image display apparatus, comprising:
the lighting apparatus of claim 1 serving as a backlight; and
an image display panel arranged on the main surface side of the light guide plate.

\* \* \* \* \*